(12) United States Patent
Park et al.

(10) Patent No.: US 7,253,101 B2
(45) Date of Patent: Aug. 7, 2007

(54) DEPOSITION METHOD OF TiN THIN FILM HAVING A MULTI-LAYER STRUCTURE

(75) Inventors: Young Hoon Park, Kyungki-do (KR); Sahng Kyoo Lee, Seoul (KR); Tae Wook Seo, Kyungki-do (KR)

(73) Assignee: IPS Ltd. (KR)

( * ) Notice: Subject to any disclaimer, the term of this patent is extended or adjusted under 35 U.S.C. 154(b) by 164 days.

(21) Appl. No.: 11/205,990

(22) Filed: Aug. 17, 2005

(65) Prior Publication Data

US 2006/0040495 A1     Feb. 23, 2006

(30) Foreign Application Priority Data

Aug. 19, 2004   (KR)   .................. 10-2004-0065300

(51) Int. Cl.
*H01L 21/4763* (2006.01)
(52) U.S. Cl. .................. 438/643; 257/E21.17
(58) Field of Classification Search ........ 438/680, 438/685, 909, 643, 648, 629, 639, 653, 618, 438/679, 675–677; 257/E21.584, E21.17
See application file for complete search history.

(56) References Cited

U.S. PATENT DOCUMENTS 6,849,298 B2 *   2/2005   Pyo .......................... 427/250

\* cited by examiner

*Primary Examiner*—David Vu
(74) *Attorney, Agent, or Firm*—Cantor Colburn LLP

(57) ABSTRACT

Provided is a method of depositing a metal nitride film having a multilayer structure and different deposition speeds on a substrate. The method is performed by forming a first lower metal nitride film on the substrate at a first deposition speed, forming a second lower metal nitride film on the first lower metal nitride film at a second deposition speed, and forming an upper metal nitride film having a large content of nitrogen (N) on a lower TiN film which is formed by the forming of the first lower metal nitride film and the second lower metal nitride film, at a third deposition speed, to improve stability with respect to exposure to air/moisture. The deposition speed of the metal nitride film having a multi-layer structure satisfies a relationship that the second deposition speed ≧ the first deposition speed ≧ the third deposition speed.

37 Claims, 6 Drawing Sheets

DEPOSITION METHOD OF TiN THIN FILM HAVING A MULTI-LAYER STRUCTURE

TECHNICAL FIELD

The present invention relates to a method of depositing a thin film, and more particularly, to a method of depositing a metal nitride (TiN) film having a multilayer structure.

BACKGROUND ART

In a process of fabricating a semiconductor, a process of depositing an electrode in an upper portion of a capacitor or a process of depositing a contact barrier metal should have capacity of depositing at a lower temperature and have a superior step coverage feature, based on a trend of an ultra thin width of a circuit wire which is being highlighted in the field of semiconductor business. When a metal nitride film is deposited at a lower temperature, various problems are generated such as high specific resistance and impurity content and a quick change in resistance when exposed to air/moisture. As a result, the properties of a device deteriorates as the device is covered by the metal nitride film having a high specific resistance. A typical example of the metal nitride film is TiN. Thus, a deposition method which can provide a low specific resistance and a relatively low impurity content at a lower temperature in a pattern having a high aspect ratio, without degrading the step coverage is greatly required in the semiconductor field.

DISCLOSURE OF INVENTION

To solve the above and/or other problems, the present invention provides a method of depositing a metal nitride film having a multilayer structure which can satisfy the property of the film, the step coverage, and the stability to a change in the quality of the film according to the exposure to air/moisture, despite of the ultra thin width of a circuit wire, the increase in a pattern aspect ratio, and the decrease in a deposition temperature.

According to an aspect of the present invention, a method of depositing a metal nitride film having a multi-layer structure and different deposition speeds on a substrate, comprises the steps of (a) forming a first lower metal nitride film on the substrate at a first deposition speed, (b) forming a second lower metal nitride film on the first lower metal nitride film at a second deposition speed, and (c) forming an upper metal nitride film having a large content of nitrogen (N) on a lower TiN film which is formed by the steps (a) and (b), at a third deposition speed, to improve stability with respect to exposure to air/moisture, wherein the deposition speed of the metal nitride film having a multi-layer structure satisfies a relationship that the second deposition speed $\geq$ the first deposition speed $\geq$ the third deposition speed.

According to another aspect of the present invention, a method of depositing a metal nitride film having a multi-layer structure and different deposition speeds on a substrate comprises the steps of (a) depositing an ALD TiN film on the substrate at a first deposition speed, (b) forming a lower TiN film by depositing a CVD TiN film on the ALD TiN film at a second deposition speed, and (c) depositing an upper TiN film having a large content of nitrogen (N) on the lower TiN film at a third deposition speed to improve stability with respect to exposure to air/moisture, wherein the deposition speed of the metal nitride film having a multi-layer structure satisfies a relationship that the second deposition speed $\geq$ the first deposition speed $\geq$ the third deposition speed.

According to another aspect of the present invention, a method of depositing a metal nitride film having a multilayer structure and different deposition speeds on a substrate comprises the steps of (a) depositing a first ALD TiN film on the substrate at a first deposition speed, (b) forming a lower TiN film by depositing a second ALD TiN film on the first ALD TiN film at a second deposition speed, and (c) depositing an upper TiN film having a large content of nitrogen (N) on the lower TiN film at a third deposition speed to improve stability with respect to exposure to air/moisture, wherein the deposition speed of the metal nitride film having a multi-layer structure satisfies a relationship that the second deposition speed $\geq$ the first deposition speed $\geq$ the third deposition speed.

According to another aspect of the present invention, a method of depositing a metal nitride film having a multi-layer structure and different deposition speeds on a substrate comprises the steps of (a) depositing a first CVD TiN film on the substrate at a first deposition speed, (b) forming a lower TiN film by depositing a second CVD TiN film on the first CVD TiN film at a second deposition speed, and (c) depositing an upper TiN film having a large content of nitrogen (N) on the lower TiN film at a third deposition speed to improve stability with respect to exposure to air/moisture, wherein the deposition speed of the metal nitride film having a multi-layer structure satisfies a relationship that the second deposition speed $\geq$ the first deposition speed $\geq$ the third deposition speed.

BEST MODE FOR CARRYING OUT THE INVENTION

The methods of depositing a metal nitride film according to embodiments of the present invention are described in FIGS. 1 through 4. A core thin film deposition method is described. The concept of an apparatus for depositing a thin film to embody the present invention is illustrated in FIGS.

Figure 7:
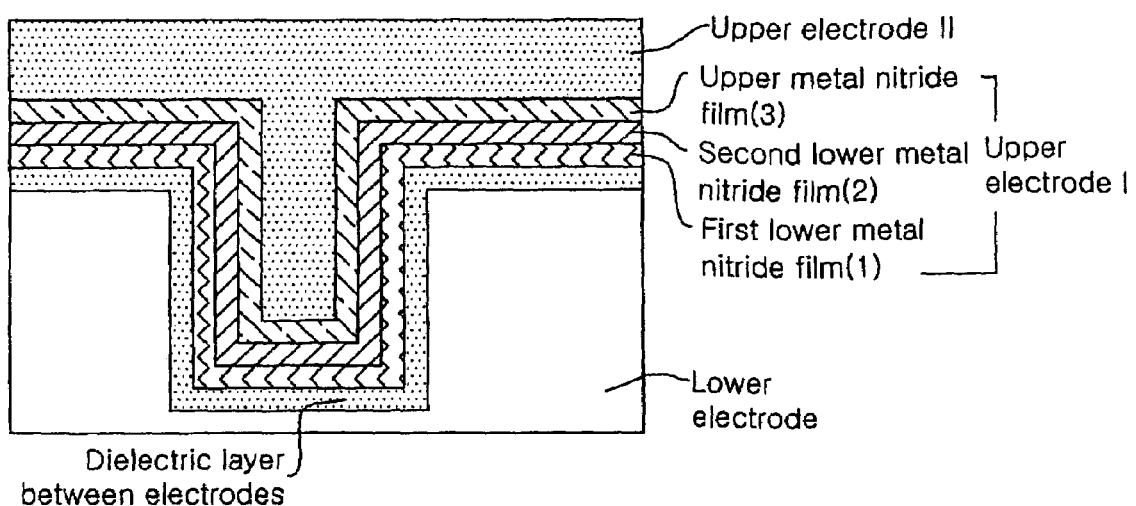
FIG. 7 is a view illustrating an example of the method of depositing a metal nitride film having a multilayer structure according to the present invention, which is an example of application to a capacitor electrode.
Figure 8:
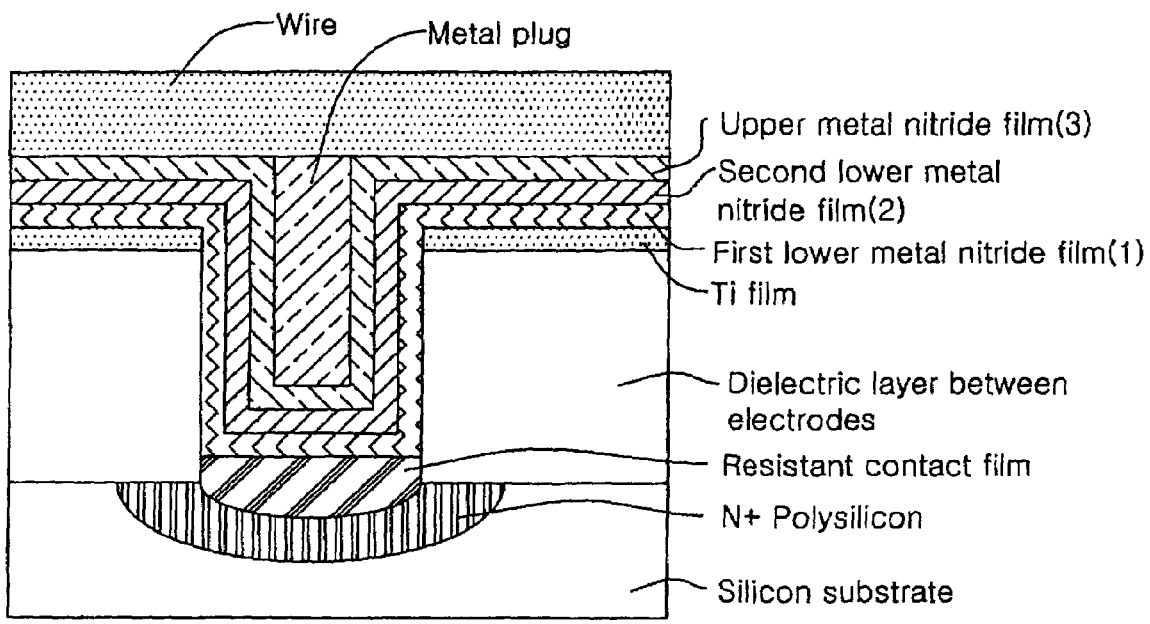
FIG. 8 is a view illustrating another example of the method of depositing a metal nitride film having a multilayer structure according to the present invention, which is an example of application to a contact barrier meal.

5 and 6. Also, examples of the present invention applied to a semiconductor devices are illustrated in FIGS. 7 and 8.

Figure 1:
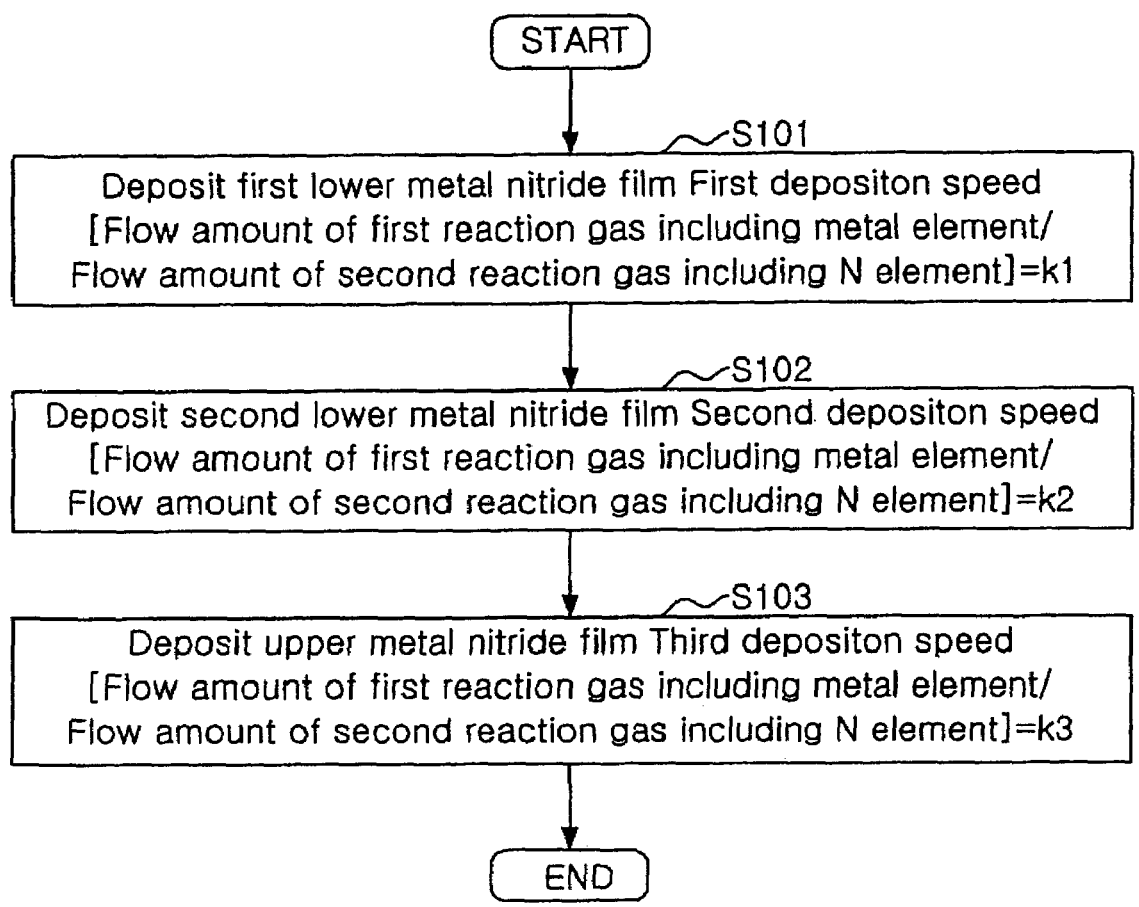
FIG. 1 is a flow chart for explaining the principle of a method of depositing a metal nitride film having a multilayer structure according to the present invention.

FIG. 1 is a flow chart for explaining the principle of a method of depositing a metal nitride film having a multilayer structure according to the present invention.

In the process of depositing a metal nitride film of a semiconductor device, the present invention is suggested as one of methods to maximize step coverage and stability with respect to the exposure to air/moisture without deterioration of its property when deposited on a pattern having a narrow aspect ratio at a low temperature.

The fundamental principle of the present invention is to deposit a metal nitride film in three steps. In the first step, a first lower metal nitride (TiN) film is formed on a substrate at a first deposition speed (S101). In the second step, a second lower metal nitride film is formed on the first lower metal nitride film formed on the substrate (S102). In the third step, an upper metal nitride film having a large content of nitrogen (N) to improve stability with respect to the exposure to air/moisture is formed at a third deposition speed on a lower metal nitride film formed of the first lower metal nitride film and the second lower metal nitride film (S103).

The speeds of depositing the metal nitride films in the first through third steps are such that the second deposition speed$\geq$the first deposition speed$\geq$the third deposition speed.

The thin films in the first and second steps S101 and S102 are defined as the lower metal nitride film while the thin film in the third step S103 is defined as the upper metal nitride film. The upper metal nitride film is a high N-rich film although it has the thinnest thickness of the three thin films and a slow deposition speed so that it functions as a barrier and protects the whole film from the air/moisture exposure.

FIGS. 7 and 8 illustrate examples of the method of depositing a metal nitride film having a multilayer structure according to the present invention. FIG. 7 shows an example of application to a capacitor electrode and FIG. 8 shows an example of application to a contact barrier meal.

The deposition speed of the first lower metal nitride film 1 is the second slowest and the second thinnest, but has higher purity than the second lower metal nitride film 2 to be deposited later. Thus, the first lower metal nitride film 1 induces a stable contact with the lower film as a whole and works as a glue layer with respect to the second lower metal nitride film 2. The functions of the first lower metal nitride film 1 and the upper metal nitride film 3 will be described first and then the function of the second lower TiN film 2 will be described. Typically, the function of the metal nitride film is a barrier property.

In FIG. 7, the metal nitride film is deposited between a dielectric layer and an upper electrode 11 to improve capacitance by decreasing leakage current of a capacitor. In FIG. 8, the metal nitride film has a function to prevent reaction between metal in the upper portion and silicon in the lower portion.

As an example, when alumina is used as a dielectric material between electrodes, although a design rule is further restricted, one of easy ways to secure reliability in the operation of a device is to deposit the metal nitride film such as TiN on the alumina. Referring back to the function of the second lower metal nitride film 2, the second lower metal nitride film 2 needs to be deposited to have a certain minimum thickness for the barrier property. Although the thickness may vary according to the design rule and various detailed requirements for the device, it can be seen that being deposited to a certain thickness or more is a prerequisite for a barrier film.

Thus, since the second lower metal nitride film 2 has the greatest thickness in a triple layered deposition film, it actually functions as a barrier film. The function of the second lower metal nitride film 2 is defined as above and depositing the second lower metal nitride film 2 exhibiting a superior step coverage at a lower temperature as fast as possible is a method to decrease CoO (Cost of Ownership). This method requires additions of one process step and TiN deposition equipment, which necessarily increases the CoO.

Figure 2:
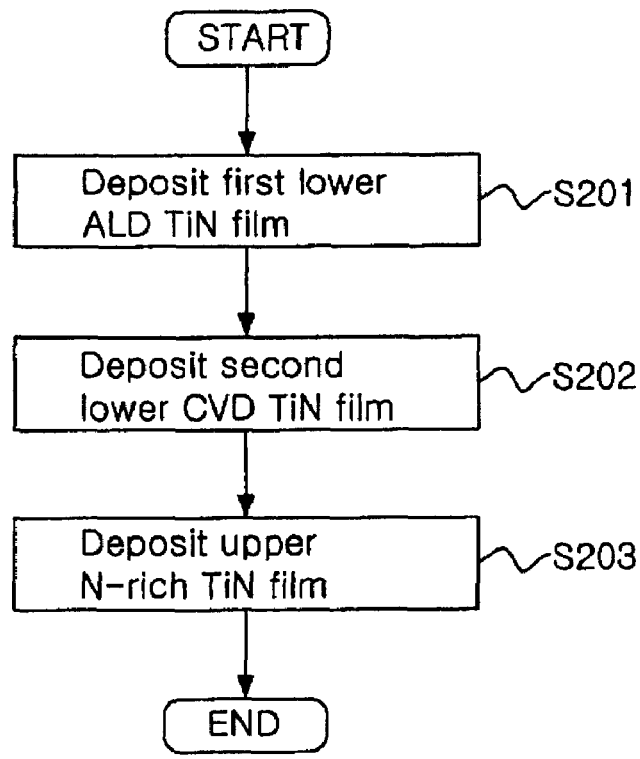
FIG. 2 is a flow chart for explaining a method of depositing a metal nitride film having a multilayer structure according to an embodiment of the present invention.
Figure 3:
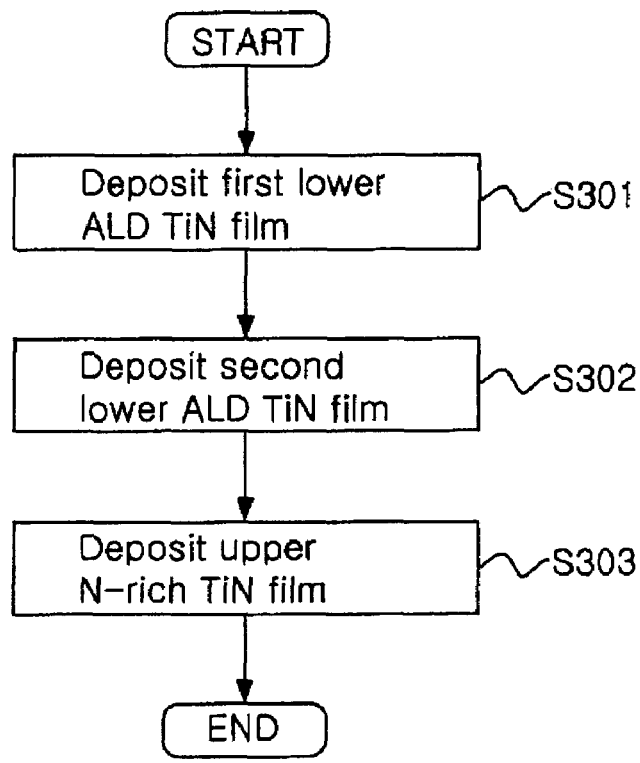
FIG. 3 is a flow chart for explaining a method of depositing a metal nitride film having a multilayer structure according to another embodiment of the present invention.
Figure 4:
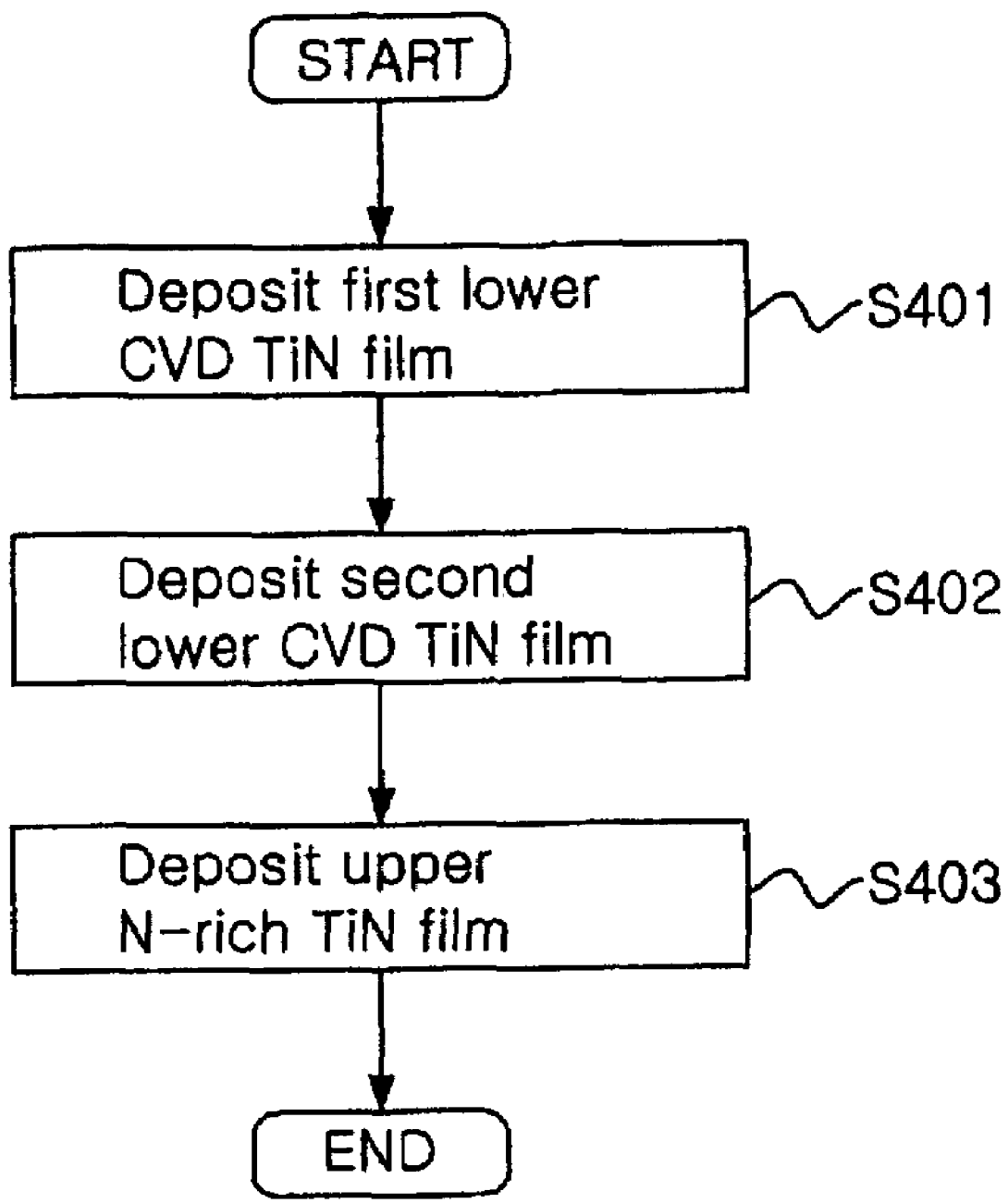
FIG. 4 is a flow chart for explaining a method of depositing a metal nitride film having a multilayer structure according to yet another embodiment of the present invention.

FIGS. 2 through 4 illustrate detailed embodiments of the present invention with an example of a TiN film based on the fundamental principle of FIG. 1. FIG. 2 is a flow chart for explaining a method of depositing a metal nitride film having a multilayer structure according to an embodiment of the present invention. In FIG. 2, an ALD TiN film is deposited as the first lower metal nitride film 1 (S201) and a CVD TiN film is deposited as the second lower metal nitride film 2 (S202).

Figure 5:
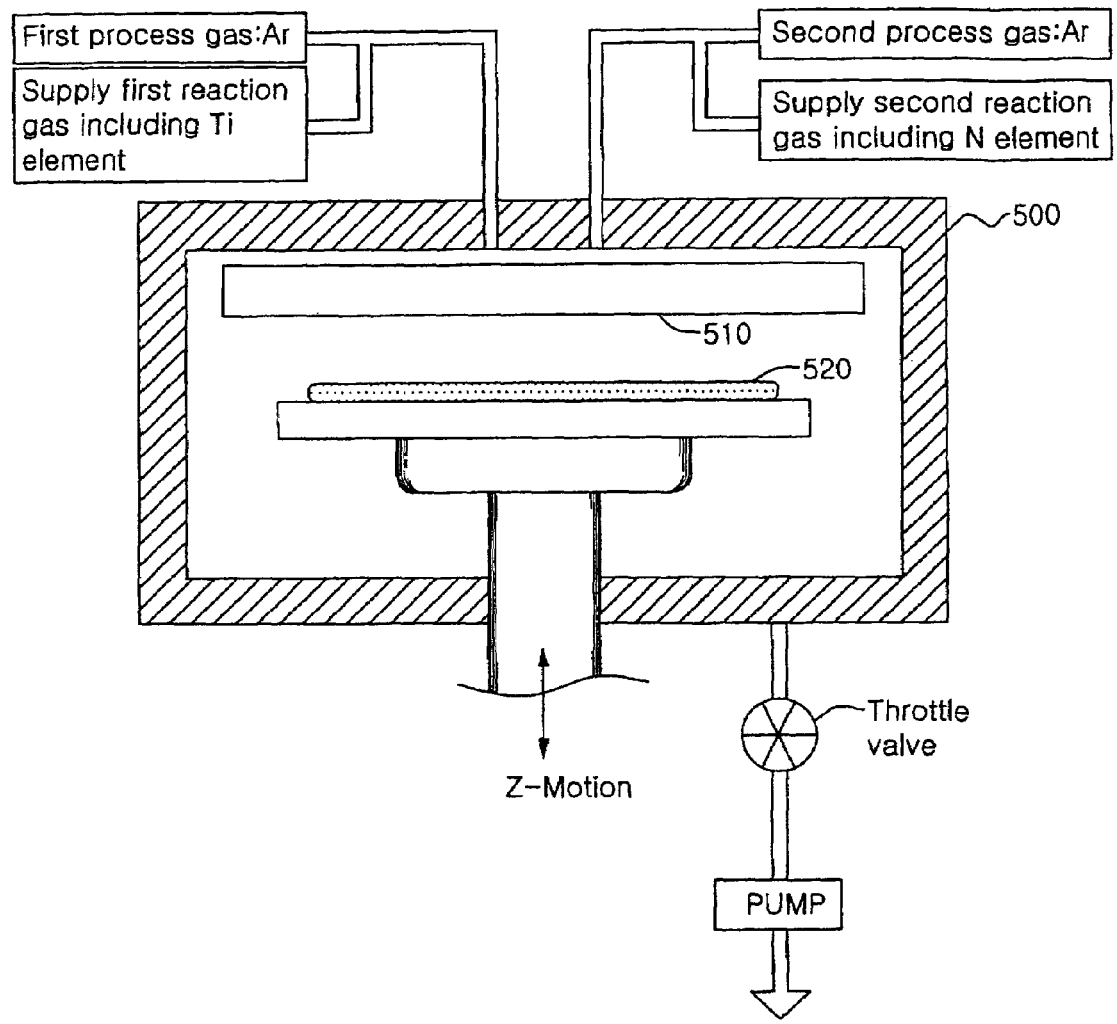
FIG. 5 is a view illustrating a reaction chamber provided to explain the method of depositing a TiN film according to the present invention.

A thin film deposition apparatus as shown in FIG. 5 is used to provide a film with the above-described function. FIG. 5 is a view illustrating a reaction chamber provided to explain the method of depositing a TiN film according to the present invention.

The lower TiN film is first formed on a substrate 520 by a mixture of first reaction gas $TiCl_4$ and a second reaction gas $NH_4$ which are ejected through a shower head 510 in a reaction chamber 500. After a predetermined time passes, to improve stability with respect to air/moisture exposure of the lower TiN film, the upper TiN film having a large content of nitrogen (N) is formed (S203).

The TiN film is deposited by turning on/off the flow of the first reaction gas including a Ti element to the substrate 520 while maintaining the amount of the flow of the first reaction gas including the Ti element at least ten times greater than that of the amount of the flow of the second reaction gas including a nitrogen (N) element and continuously injecting the amount of the flow of the second reaction gas including a nitrogen (N) element onto the substrate 520.

Thus, when an ALD TiN thin that is the first lower metal nitride film 1 and a CVD TiN film that is the second lower metal nitride film 2 are deposited in a single chamber, in a state in which the temperature of a wafer block is fixed, in depositing the ALD TiN film, a first process interval, that is, a sufficient process interval, is decreased so that an ALD thin film is substantially deposited by maximizing a fuzzy efficiency and, in depositing the CVD TiN film, the process interval is increased quite greater than a second process interval, that is, the process interval for the deposition of the ALD TiN film, so that laminar gas flow that is intrinsic to the CVD process is introduced to be applied to the substrate. Unlike the deposition of the ALD TiN film, during the deposition of the CVD TiN film, the wider process interval is advantageous in view of the step coverage or uniformity of the film.

Figure 6:
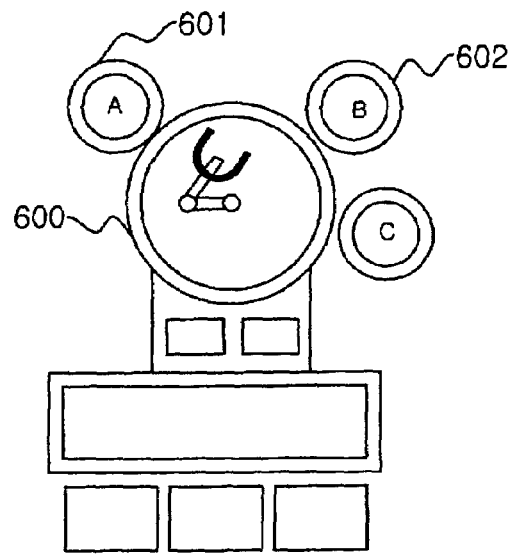
FIG. 6 is a view illustrating a cluster system provided to explain the method of depositing a TiN film according to the present invention.

The ALD TiN film that is the first lower metal nitride film 1 and the CVD TiN film that is the second lower metal nitride film 2 can be deposited in different chambers. This is performed for a case in which differentiating the temperature of the wafer block of the deposition step of the ALD TiN film and the deposition step of the CVD TiN film is more advantageous. In this case, in a cluster tool system as shown in FIG. 6, the ALD TiN film can be deposited in a reaction chamber A 601 attached to a transfer chamber 600 and the CVD TiN film can be deposited in a reaction chamber B 602 transferred by the transfer chamber 600. The temperature of the wafer block of the reaction chamber A 601 where the ALD TiN film is deposited and the temperature of the wafer block of the reaction chamber B 602 where the CVD TiN film is deposited are different from each other.

FIG. 3 is a flow chart for explaining a method of depositing a metal nitride film having a multilayer structure according to another embodiment of the present invention. In FIG. 3, the ALD TiN film is deposited as the first lower metal nitride film 1 (S301) while the ALD TiN film is also deposited as the second lower metal nitride film 2 (S302). That is, both the first and second lower metal nitride films 1 and 2 are deposited in the ALD method. Then, after a predetermined time passes, to improve stability with respect to the air/moisture exposure on the lower TiN film, the upper TiN film having a large content of nitrogen (N) is formed (S303).

The ALD TiN film of the second lower metal nitride film 2 described in the present invention includes in a strict sense an ALD deposition reaction including a certain degree of CVD reaction, that is, at least one time of a Tin mono atom layer, not merely signifies a precise ALD deposition mechanism forming a mono atom layer at one time. However, a valve control method in a reaction gas transfer system is not different from the form during the deposition of the first ALD TiN film. The second ALD TiN film, in which the second ALD TiN film is deposited in form of ALD at a deposition speed much faster than in the deposition in the ALD method, is advantageous in the view of the step coverage or the purity of the film although it is disadvantageous in the speed of deposition than adopting a pure CVD deposition method FIG. 4 is a flow chart for explaining a method of depositing a metal nitride film having a multilayer structure according to yet another embodiment of the present invention. Referring to FIG. 4, a CVD TiN film is deposited as the first lower metal nitride film 1 (S401) and a CVD TiN film is deposited as the second lower metal nitride film 2 (S402). That is, both the first and second lower metal nitride films 1 and 2 are deposited in a CVD method. Then, after a predetermined time passes, the upper TiN film including a large content of nitrogen (N) is formed on the lower TiN film to improve stability with respect to the air/moisture exposure (S403).

The method described in FIG. 4 is preferably applied to one of the above-described embodiments which has the most largest allowance in the aspect ratio or the design rule in the circuit wire width. That is, that is the case requiring thin film deposition having a high productivity rather than an extremely high property.

As illustrated in FIGS. 1 through 4, all of the above-described embodiments of the present invention can be further effectively performed by an equipment capable of adjusting a process interval as shown in FIG. 5. In all the embodiments, the metal nitride film is deposited using simultaneous or alternating injection of the first reaction gas including the Ti element and the second reaction gas including the N element while the first process gas "Ar" and the second process gas "Ar'" are continuously injected onto the substrate through the shower head which does not connect both process gases.

In the above-described present embodiments, the first reaction gas including the Ti element is $TiCl_4$, the second reaction gas including the N element is $NH_3$. Also, in the present embodiments, the first deposition speed is between 50-55 Å/min, the second deposition speed is between 50-500 Å/min, and the third deposition speed is not greater than 5 Å/min.

Also, the metal nitride film having a triple layer structure according to the present invention is used as a barrier film between a dielectric layer between electrodes and a material for the electrodes or as a barrier film formed on a Ti film in a metal contact process. In the thickness T1 of the first metal nitride film, the thickness T2 of the second metal nitride film, and the thickness T3 of the third metal nitride film, it is preferable to maintain a relationship that T2>T1>T3.

While this invention has been particularly shown and described with reference to preferred embodiments thereof, it will be understood by those skilled in the art that various changes in form and details may be made therein without departing from the spirit and scope of the invention as defined by the appended claims.

INDUSTRIAL APPLICABILITY

As described above, according to the present invention, despite of the ultra thin width of a circuit wire, the increase in a pattern aspect ratio, and the decrease in a deposition temperature, the property of the film, the step coverage, and the stability to a change in the quality of the film with respect to the exposure to air/moisture are all satisfied.

What is claimed is:

1. A method of depositing a metal nitride film having a multi-layer structure and different deposition speeds on a substrate, the method comprising the steps of:
    (a) forming a first lower metal nitride film on the substrate at a first deposition speed;
    (b) forming a second lower metal nitride film on the first lower metal nitride film at a second deposition speed; and
    (c) forming an upper metal nitride film having a large content of nitrogen (N) on a lower TiN film which is formed by the steps (a) and (b), at a third deposition speed, to improve stability with respect to exposure to air/moisture,
    wherein the deposition speed of the metal nitride film having a multi-layer structure satisfies a relationship that the second deposition speed≧the first deposition speed≧the third deposition speed.

2. The method of claim 1, wherein a ratio Kn, where n=1, 2, 3, of a first reaction gas including a metal element/a second reaction gas including an N element for the deposition of the metal nitride film having a multi-layer structure satisfies a relationship that K2≧K1≧K3.

3. The method of claim 1, wherein the metal nitride film is deposited using simultaneous or alternating injection of a first reaction gas including a Ti element and a second reaction gas including a N element while a first process gas "Ar" and a second process gas "Ar'" are continuously injected onto the substrate through a shower head which does not connect both process gases.

4. The method of claim 1, wherein the first lower metal nitride film stabilizes a boundary surface and functions as a glue layer, includes impurities less than the second lower metal nitride film, and is deposited to a low thickness.

5. The method of claim 1, wherein the second lower metal nitride film has the greatest thickness informing a multilayer deposition film, functions as a barrier film, exhibits a superior step coverage at a lower temperature, and is quickly deposited than other deposition films.

6. The method of claim 1, wherein the multilayer deposition film forms a deposition structure in the same chamber.

7. The method of claim 1, wherein the multilayer deposition film forms a deposition structure in another chamber attached to a transfer chamber.

8. The method of claim 1, wherein the upper TiN film is deposited while an amount of flow of a second reaction gas including a N element is maintained at least ten times greater than an amount of flow of a first reaction gas including a Ti element.

9. The method of claim 8, wherein the first reaction gas including the Ti element is $TiCl_4$ and the second reaction gas including the N element is $NH_3$.

10. The method of claim 1, wherein the first deposition speed is 50-55 Å/min, the second deposition speed is 50-500 Å/min, and the third deposition speed is not greater than 5 Å/min.

11. The method of claim 1, wherein the metal nitride film having the multilayer structure is used as a barrier film between a dielectric layer between electrodes and a material for the electrodes or deposited as a barrier film on a Ti film in a metal contact process.

12. The method of claim 1, wherein a thickness T1 of a first metal nitride film, a thickness T2 of a second metal nitride film, and a thickness T3 of a third metal nitride film satisfy a relationship that T2>T1>T3.

13. A method of depositing a metal nitride film having a multilayer structure and different deposition speeds on a substrate, the method comprising the steps of:
(a) depositing an ALD TiN film on the substrate at a first deposition speed;
(b) forming a lower TiN film by depositing a CVD TiN film on the ALD TiN film at a second deposition speed; and
(c) depositing an upper TiN film having a large content of nitrogen (N) on the lower TiN film at a third deposition speed to improve stability with respect to exposure to air/moisture,
wherein the deposition speed of the metal nitride film having a multi-layer structure satisfies a relationship that the second deposition speed≧the first deposition speed≧the third deposition speed.

14. The method of claim 13, wherein, when a distance from a bottom of a shower head to a surface of a heater is defined as a process interval, the ALD TiN film is deposited while maintaining a first process interval and the CVD TiN film is deposited while maintaining a second process interval whish is not less than the first process interval.

15. The method of claim 14, wherein the ALD TiN film and the CVD TiN film are deposited in the same reaction chamber.

16. The method of claim 14, wherein the ALD TiN film is formed after the subtract is accommodated on a wafer block maintained at a first temperature in a first reaction chamber attached to a transfer chamber, and the CVD TiN film is formed after the substrate is accommodated on the wafer block maintained at a second temperature higher than the first temperature in a second reaction chamber attached to the transfer chamber.

17. The method of claim 13, wherein the upper TiN film is deposited while an amount of flow of a second reaction gas including a N element is maintained at least ten times greater than an amount of flow of a first reaction gas including a Ti element.

18. The method of claim 13, wherein the first deposition speed is 50-55 Å/min, the second deposition speed is 50-500 Å/min, and the third deposition speed is not greater than 5 Å/min.

19. The method of claim 13, wherein the metal nitride film having the multilayer structure is used as a barrier film between a dielectric layer between electrodes and a material for the electrodes or deposited as a barrier film on a Ti film in a metal contact process.

20. The method of claim 13, wherein a thickness T1 of a first metal nitride film, a thickness T2 of a second metal nitride film, and a thickness T3 of a third metal nitride film satisfy a relationship that T2>T1>T3.

21. A method of depositing a metal nitride film having a multilayer structure and different deposition speeds on a substrate, the method comprising the steps of:
(a) depositing a first ALD TiN film on the substrate at a first deposition speed;
(b) forming a lower TiN film by depositing a second ALD TiN film on the first ALD TiN film at a second deposition speed; and
(c) depositing an upper TiN film having a large content of nitrogen (N) on the lower TiN film at a third deposition speed to improve stability with respect to exposure to air/moisture,
wherein the deposition speed of the metal nitride film having a multi-layer structure satisfies a relationship that the second deposition speed≧the first deposition speed≧the third deposition speed.

22. The method of claim 21, wherein, when a distance from a bottom of a shower head to a surface of a heater is defined as a process interval, the first ALD TiN film is deposited while maintaining a first process interval and the second ALD TiN film is deposited while maintaining a second process interval which is not less than the first process interval.

23. The method of claim 22, wherein the height of an atom layer of the second ALD TiN film deposited per cycle is greater than that of an atom layer of the first ALD TiN film deposited per cycle.

24. The method of claim 22, wherein the first ALD TiN film and the second ALD TiN film are deposited in the same reaction chamber.

25. The method of claim 22, wherein the ALD TiN film is formed after the subtract is accommodated on a wafer block maintained at a first temperature in a first reaction chamber attached to a transfer chamber, and the second ALD TiN film is formed after the substrate is accommodated on the wafer block maintained at a second temperature higher than the first temperature in a second reaction chamber attached to the transfer chamber.

26. The method of claim 21, wherein the upper TiN film is deposited while an amount of flow of a second reaction gas including a N element is maintained at least ten times greater than an amount of flow of a first reaction gas including a Ti element.

27. The method of claim 21, wherein the first deposition speed is 50-55 Å/min, the second deposition speed is 50-500 Å/min, and the third deposition speed is not greater than 5 Å/min.

28. The method of claim 21, wherein the metal nitride film having the multilayer structure is used as a barrier film between a dielectric layer between electrodes and a material for the electrodes or deposited as a barrier film on a Ti film in a metal contact process.

29. The method of claim 21, wherein a thickness T1 of a first metal nitride film, a thickness T2 of a second metal nitride film, and a thickness T3 of a third metal nitride film satisfy a relationship that T2>T1>T3.

30. A method of depositing a metal nitride film having a multilayer structure and different deposition speeds on a substrate, the method comprising the steps of:
(a) depositing a first CVD TiN film on the substrate at a first deposition speed;
(b) forming a lower TiN film by depositing a second CVD TiN film on the first CVD TiN film at a second deposition speed; and
(c) depositing an upper TiN film having a large content of nitrogen (N) on the lower TiN film at a third deposition speed to improve stability with respect to exposure to air/moisture,
wherein the deposition speed of the metal nitride film having a multi-layer structure satisfies a relationship that the second deposition speed $\geq$ the first deposition speed $\geq$ the third deposition speed.

31. The method of claim 30, wherein, when a distance from a bottom of a shower head to a surface of a heater is defined as a process interval, the first CVD TiN film is deposited while maintaining a first process interval and the second CVD TiN film is deposited while maintaining a second process interval which is not less than the first process interval.

32. The method of claim 31, wherein the first CVD TiN film and the second CVD TiN film are deposited in the same reaction chamber.

33. The method of claim 31, wherein the first CVD TiN film is formed after the subtract is accommodated on a wafer block maintained at a first temperature in a first reaction chamber attached to a transfer chamber, and the second CVD TiN film is formed after the substrate is accommodated on the wafer block maintained at a second temperature higher than the first temperature in a second reaction chamber attached to the transfer chamber.

34. The method of claim 30, wherein the upper TiN film is deposited while an amount of flow of a second reaction gas including a N element is maintained at least ten times greater than an amount of flow of a first reaction gas including a Ti element.

35. The method of claim 30, wherein the first deposition speed is 50-55 Å/min, the second deposition speed is 50-500 Å/min, and the third deposition speed is not greater than 5 Å/min.

36. The method of claim 30, wherein the metal nitride film having the multilayer structure is used as a barrier film between a dielectric layer between electrodes and a material for the electrodes or deposited as a barrier film on a Ti film in a metal contact process.

37. The method of claim 30, wherein a thickness T1 of a first metal nitride film, a thickness T2 of a second metal nitride film, and a thickness T3 of a third metal nitride film satisfy a relationship that T2>T1>T3.

* * * * *